United States Patent
McEwen

(10) Patent No.: US 6,844,779 B2
(45) Date of Patent: Jan. 18, 2005

(54) OPTICALLY ISOLATED BIAS CONTROL CIRCUIT

(75) Inventor: Thomas A. McEwen, Verona, NY (US)

(73) Assignee: The United States of America as represented by the Secretary of the Air Force, Washington, DC (US)

(*) Notice: Subject to any disclaimer, the term of this patent is extended or adjusted under 35 U.S.C. 154(b) by 27 days.

(21) Appl. No.: 10/465,719

(22) Filed: Jun. 19, 2003

(65) Prior Publication Data

US 2004/0257155 A1 Dec. 23, 2004

(51) Int. Cl.[7] .......................... H03F 17/00; H03F 3/08; G02B 27/00
(52) U.S. Cl. .......................... 330/59; 330/308; 250/551
(58) Field of Search .................... 330/59, 308; 250/551

(56) References Cited

U.S. PATENT DOCUMENTS

| | | | | |
|---|---|---|---|---|
| 4,516,067 A | * | 5/1985 | Hoffman | 323/265 |
| 4,712,020 A | * | 12/1987 | Basile | 307/117 |
| 5,563,777 A | * | 10/1996 | Miki et al. | 363/37 |
| 5,886,508 A | * | 3/1999 | Jutras | 323/267 |
| 6,466,463 B1 | * | 10/2002 | Morita | 363/21.16 |
| 6,504,733 B1 | * | 1/2003 | Watson, III et al. | 363/19 |

* cited by examiner

Primary Examiner—Patricia Nguyen
(74) Attorney, Agent, or Firm—Joseph A. Mancini

(57) ABSTRACT

Optically isolated bias control circuit which provides bias current for switching circuits. Invention is amenable to high speed switching control with instantaneously variable pulse widths and duty cycles. Invention can be operated from DC upward in frequency, limited only by the characteristics of the implementing electrical components and electrical interconnections. Complementary embodiments of invention provide high speed operation with minimal electrical charge flow. Solar powered embodiments of invention may be used to control the switching of high power MOSFET-based switching circuits.

11 Claims, 9 Drawing Sheets

OPTICALLY ISOLATED BIAS CONTROL CIRCUIT

STATEMENT OF GOVERNMENT INTEREST

The invention described herein may be manufactured and used by or for the Government for governmental purposes without the payment of any royalty thereon.

BACKGROUND OF THE INVENTION

A common method of controlling a MOSFET in "high-side" connected circuits requires the use of a voltage isolating pulse transformer in the gate-to-source biasing circuit. "High-side" refers to a circuit configured with the MOSFET switch connected between the supply voltage and the load impedance; it is connected to the higher voltage side of the load impedance. A "low-side" connected MOSFET does not, typically, present damaging gate-to-source voltages, but then one end of the load impedance is connected to the high side of the supply voltage. A voltage isolating pulse transformer can be used in "high-side" circuits; it allows the gate-to-source circuit to float (electrically) near the source potential which prevents the gate-to-source voltage from reaching device damaging values. Disadvantages of simple transformer biasing include a lower limit to the frequencies of useful operation (this precludes DC operation), pulse transformers designed to isolate high voltages can be expensive and unreliable, and transformers capable of low frequency operation are large and heavy.

REFERENCES

[1] *International Rectifier Application Note AN978*, "HV Floating MOS-Gate Driver IC's"
[2] *Hewlett Packard Technical Datasheet for HCPL-3100/310*, "Power MOSFET/IGBT Gate Drive Optocouplers"

OBJECTS AND SUMMARY OF THE INVENTION

One object of the present invention is to provide a simple, low power and lightweight optical means for controlling the bias signal applied to high voltage and high current witching supply circuits.

Another object of the present invention is to provide a means for generating wide frequency-range bias signals for application to high voltage and high current switching supply circuits.

Yet another object of the present invention is to provide a bias signal source that operates at DC for application to high voltage and high current switching supply circuits.

Still another object of the present invention is to provide a means for generating and controlling a bias signal for application to high voltage supply circuits that does not require the use of high voltage isolation transformers.

The invention described herein provides an optically isolated circuit which provides bias voltage and bias current for switching circuits. Invention is amenable to high speed switching control with instantaneously variable pulse widths and duty cycles. Invention can be operated from DC upward in frequency, limited only by the characteristics of the implementing electrical components and electrical interconnections. Complementary operation of the invention provides high speed operation with minimal electrical charge flow so as to increase efficiency while the inventions's low output impedance enhances noise immunity. Solar powered embodiments of invention may be used to control the switching of high power MOSFET-based switching circuits without the use of a high voltage isolation transformer.

According to an embodiment of the present invention, an optically isolated bias control circuit, comprises a bias voltage source connected in series with a diode, the anode of the diode being connected to the positive terminal of the bias voltage source, the cathode of the diode being connected to the collector of a first phototransistor, the negative terminal of the bias voltage source being connected to a floating ground; an energy storage capacitor and a low inductance capacitor both connected in parallel with each other and in parallel with the series connected bias voltage source and the diode, wherein the positive terminal of each of the energy storage capacitor and the low inductance capacitor is connected to the collector of the first phototransistor, the negative terminal of each of the capacitors being connected to the floating ground; and a second phototransistor and an inductor, the inductor being connected between the collector of the second phototransistor and the emitter of the first phototransistor, the emitter of the second phototransistor being connected to the floating ground, and the collector of the second phototransistor being further connectable so as to drive the input of a high input impedance switching device for switching a voltage across a load impedance.

According to another embodiment of the present invention, an optically isolated bias control circuit, comprises a bias voltage source connected in series with a diode, the anode of the diode being connected to the positive terminal of the bias voltage source, the cathode of the diode being connected to the collector of a first phototransistor, the negative terminal of the voltage source being connected to the emitter of a third phototransistor; an energy storage capacitor and a low inductance capacitor both connected in parallel with each other and in parallel with the series connected bias voltage source and the diode, wherein the positive terminal of each of the energy storage capacitor and the low inductance capacitor is connected to the collector of the first phototransistor, the negative terminal of each of the capacitors being connected to the emitter of the third phototransistor; a second phototransistor having its collector connected through an inductor to the emitter of the first phototransistor and also having its collector being connectable so as to drive the input of a high input impedance switching device for switching a voltage across a load impedance; and a fourth phototransistor having its collector connected to the collector of the first phototransistor and having its emitter connected to the collector of the third phototransistor.

According to yet another embodiment of the present invention, a high-voltage optically isolated bias control circuit, comprises a plurality of the optically isolated bias control circuits of either aforementioned embodiments wherein, for each of the plurality of the optically isolated bias control circuits, a voltage surge suppressor, wherein the first terminal of the voltage surge suppressor is connected to the drain of the N-channel enhancement MOSFET and the second terminal of the voltage surge suppressor is connected to the source of the N-channel enhancement MOSFET; and wherein each of the plurality of the optically isolated bias control circuits is connected in series with a high voltage source and a load impedance.

According to still yet another embodiment of the present invention, a self-powered, optically isolated bias control circuit, comprises either aforementioned embodiments of the optically isolated bias control circuit; a pulse transformer, wherein the primary winding is connected in series between the source of the N-channel enhancement MOSFET and a load impedance, a center tap of the secondary winding is connected to the source of the N-channel enhancement MOSFET, one end of the secondary winding is connected to the anode a second diode, with the cathode of the second diode being connected to the collector of the first phototransistor, and the other end of the secondary winding is connected to the anode of a third diode, with the cathode of the third diode also being connected to the collector of the first phototransistor.

According to an additional embodiment of the present invention, a solar-powered, optically isolated bias control circuit, comprises either aforementioned embodiments of the optically isolated bias control circuit; a light-emitting device; and a resistor, wherein the light emitting device and the resistor are connected in series with each other between the drain of the N-channel enhancement MOSFET and the negative terminal of the drain voltage source.

Advantages and New Features

There are several advantages attributable to the present invention relative to prior art methods of bias control for electrical switching circuits.

A fundamental advantage of the present invention is its inherent low output impedance which enhances the speed and noise immunity of the bias control circuit when operated with complementary optical drive circuits.

An important advantage is the fact that the present invention provides switching control of high voltages across loads without the use of high voltage isolation transformers.

A related advantage stems from the fact that the present invention employs optical coupling, therefore it is not so limited in frequency as are simple transformer-based switching control circuits. The present invention can be operated with very high voltage isolation enabled by the use of free-space optics or fiber-optics for the transmission of optical control signals.

Another advantage is the fact that the present invention may provide control signals at DC, whereas simple transformer-based switching control circuits cannot.

Still another advantage is the fact that the present invention may be either self-powered or solar-powered.

Yet still another advantage is the fact that either solar-powered or pulse transformer self-powered bias voltage sources can be bootstrapped together so as to provide increased bias voltage and bias current for switching even higher voltages and higher currents with the same low power optical control signals.

DETAILED DESCRIPTION OF THE PREFERRED EMBODIMENT

Figure 1:
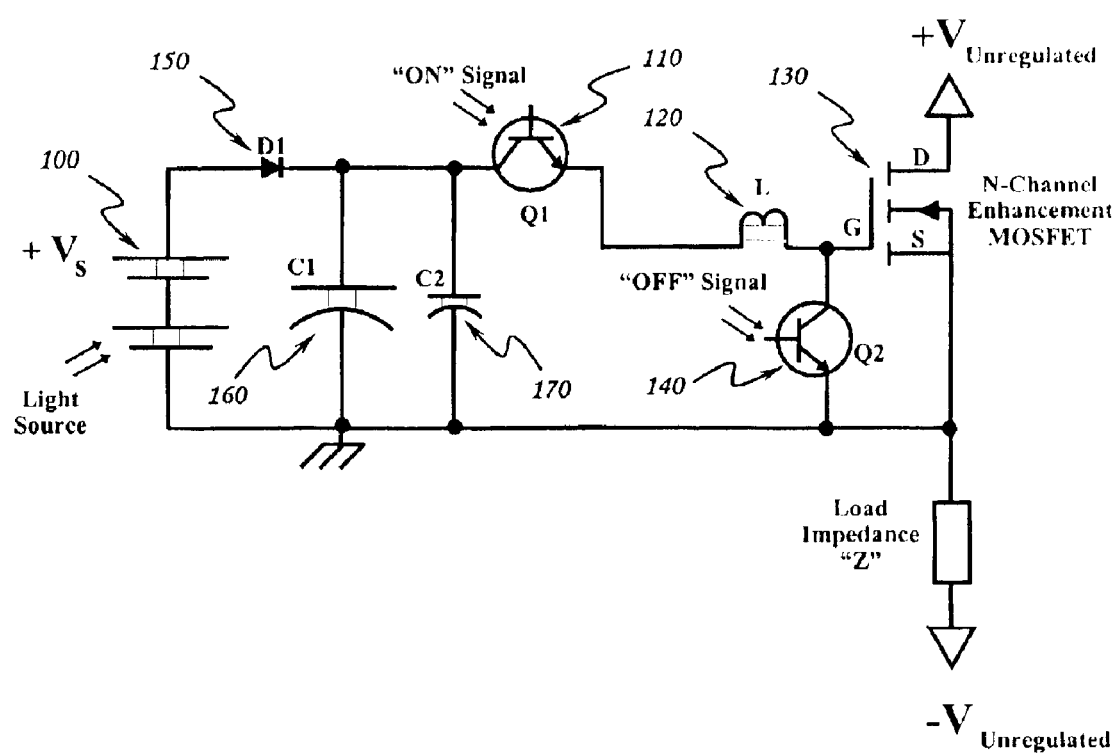
FIG. 1 depicts a schematic of the preferred embodiment of the present invention using two optically isolating photo-transistors.
Figure 3:
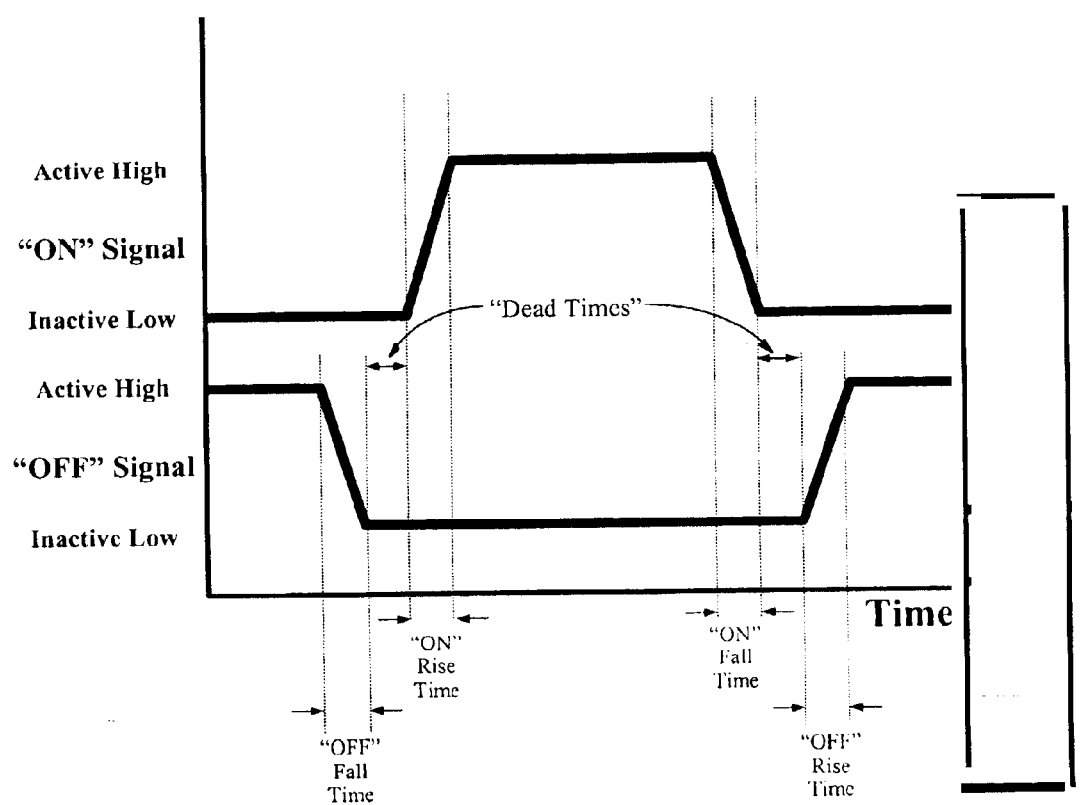
FIG. 3 depicts a timing diagram of the preferred embodiment of the present invention wherein complementary optical signals are employed.

Referring to FIG. 1, a schematic of the present invention is shown. This preferred embodiment of the present invention comprises a floating bias voltage source 100 positive terminal electrically connected in series to the collector of a photo-transistor (Q1) 110. The emitter of Q1 110 is connected in series through inductance (L) 120 to the parallel connected N-channel enhancement-mode MOSFET 130 gate (G) and collector of another photo-transistor (Q2) 140. The emitter of Q2 140 is connected to both the MOSFET source (S) and to the negative terminal of the bias voltage source. The bias voltage source 100 may be either a solar power source or a battery, and with its positive voltage terminal electrically connected in series with a diode D1 150 (for solar source) to a parallel connected energy storage capacitor (C1) 160 and low inductance capacitor (C2) 170 which are series connected to the negative voltage terminal of the bias voltage source 100 (solar powered source or battery). Operation of this embodiment of the present invention requires the illumination of the solar powered source or connection to a battery to achieve the operating voltage across the energy storage capacitor C1 160. When the operating voltage is reached, two complementary "ON" and "OFF" light signal pulses are applied to the light sensitive base regions of the photo-transistors Q1 110 and Q2 140, respectively. Minimal charge flow is achieved by allowing the active high "ON" light signal to be applied in the high state to photo-transistor Q1 110 only when the active high "OFF" light signal applied to photo-transistor Q2 140 is in the low state (see FIG. 3 "TIMING DIAGRAM"). This prevents the direct shorting of the bias voltage source 100 (solar power source or battery) through both phototransistors 110, 140 and reduces the flow of charge required to control the MOSFET 130 switching circuit. It is important to apply "ON" and "OFF" light signal pulses which have minimal rise and fall times to ensure that the MOSFET 130 is driven as fast as possible through its switching states. Darlington photo-transistors may be used to reduce the rise and fall times of the control pulses. This decreases the time in which the MOSFET 130 has drain-to-source resistances which can dissipate heat (waste energy), cause the device temperature to increase and possibly damage the MOSFET 130. It is important to note that the stray capacitance of photo-transistor (Q2) 140 together with the MOSFET 130 gate capacitance, inductances of the source and drain, and Miller effects will affect the efficiency of operation as a function of frequency and the range of effective switching pulse widths and duty cycles. Switched capacitor circuits can dissipate energy by radiation and generate electromagnetic noise. A properly selected small inductance (L) 120 in series with the gate can reduce switching losses by appropriately slowing the gate capacitor charging time.

ALTERNATE EMBODIMENTS OF THE PRESENT INVENTION

Alternate Embodiment #1

Figure 2:
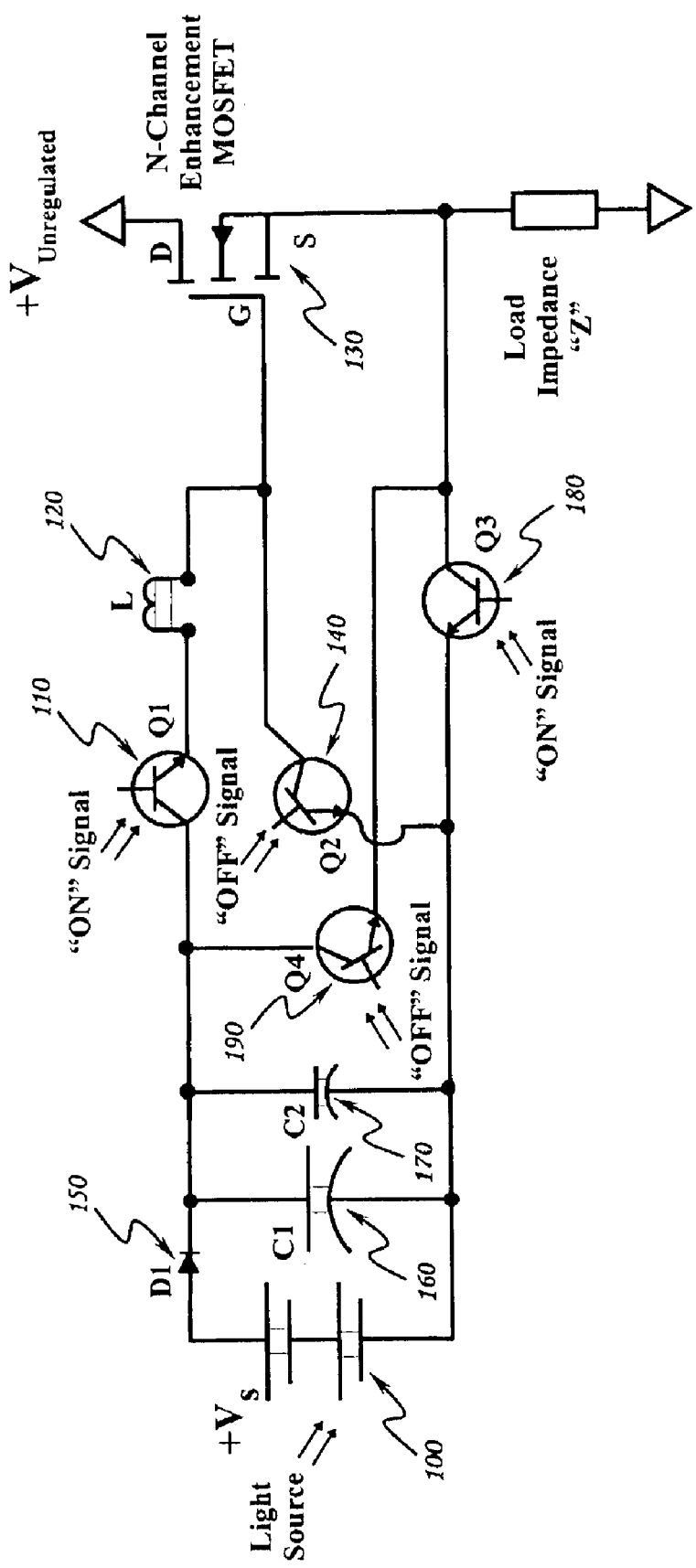
FIG. 2 depicts a schematic of an alternate embodiment of the present invention with reversing bias polarity for fast "on" and "off" times with enhanced noise immunity, using four optically isolating photo-transistors.

Referring to FIG. 2, a first alternative embodiment of the invention is depicted. The first alternate embodiment of the present invention involves the use of two additional optically isolating photo-transistors Q3 180 and Q4 190. This embodiment effectively reverses the polarity of the bias voltage source 100 applied to the gate-to-source circuit of the MOSFET 130 in order to force the circuit off as fast as it is forced on. This circuit has enhanced noise immunity due to a negative gate-to-source voltage and may be able to operate with pulses of faster rise and fall times than the embodiment depicted in FIG. 1 with a given gate control voltage, but it requires two additional optically isolating devices.

Figure 4:
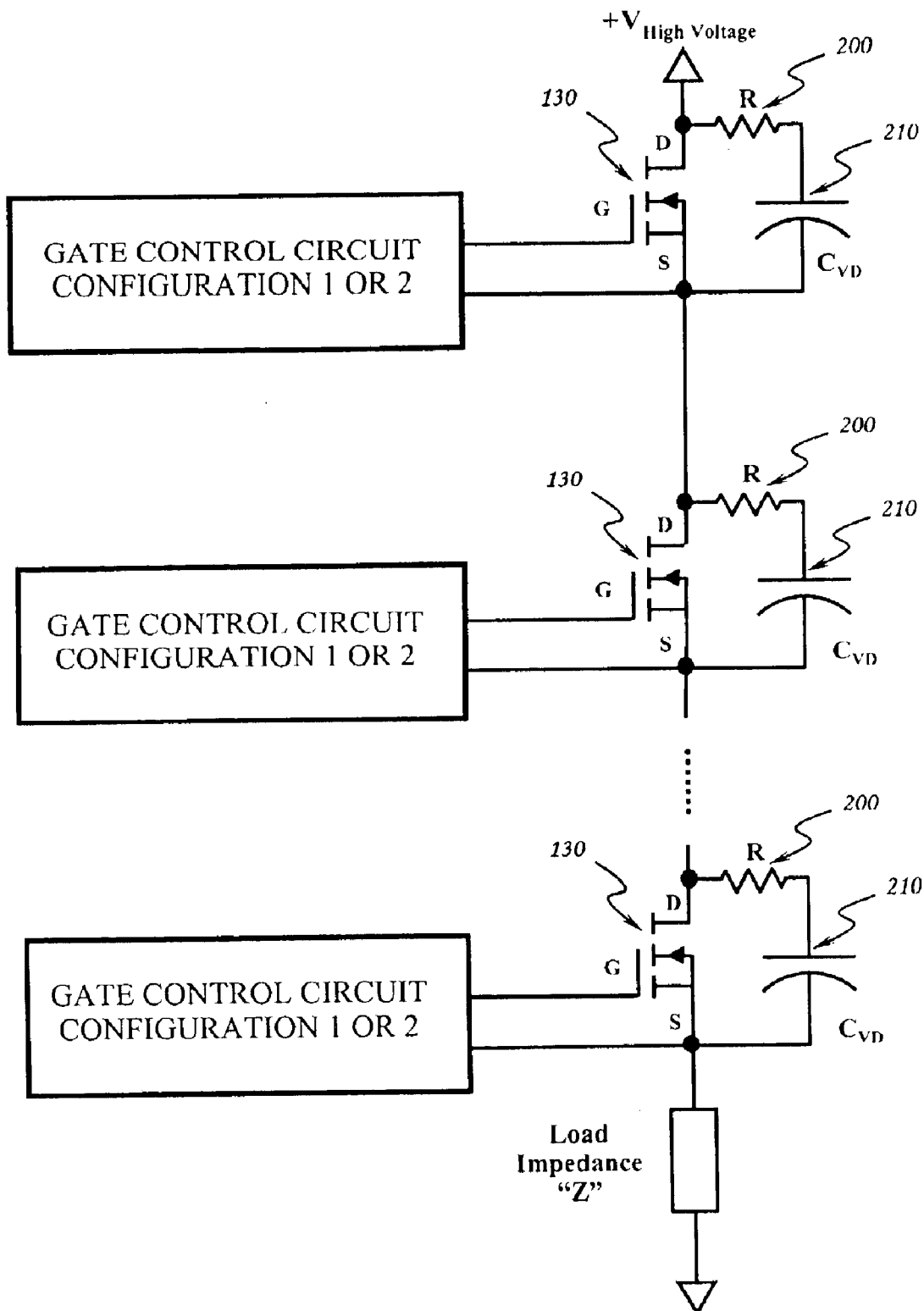
FIG. 4 depicts a block diagram of a series connection of a plurality of either of the embodiments of the present invention so as to allow higher voltages applied to loads than could be applied using single switching transistors.

Referring to FIG. 4, a series connection of either embodiment of the gate bias control circuits (see FIG. 1 or FIG. 2) is depicted that enables operating voltages greater than a single MOSFET can hold off. The series of gate bias control circuits must receive the complementary light signals in-phase, so that all of the corresponding devices switch "on" and "off" simultaneously. "Snubber" circuits, consisting of Capacitors $C_{VD}$ 210 in series with resistors R 200 are connected in parallel with the MOSFETs 130 and function as voltage dividing capacitors that help to prevent damaging excess voltages from occurring on any single MOSFET 130 during the switching transitions. Metal oxide varistors or other voltage surge suppressors can also be used for this purpose. The present invention can also be adapted to other high input impedance device circuits such as Insulated Gate Bipolar Transistor (IGBT) circuits. IGBT devices have higher voltage capabilities with lower "on" resistances, but have slower turn-off characteristics than MOSFETs.

Figure 5:
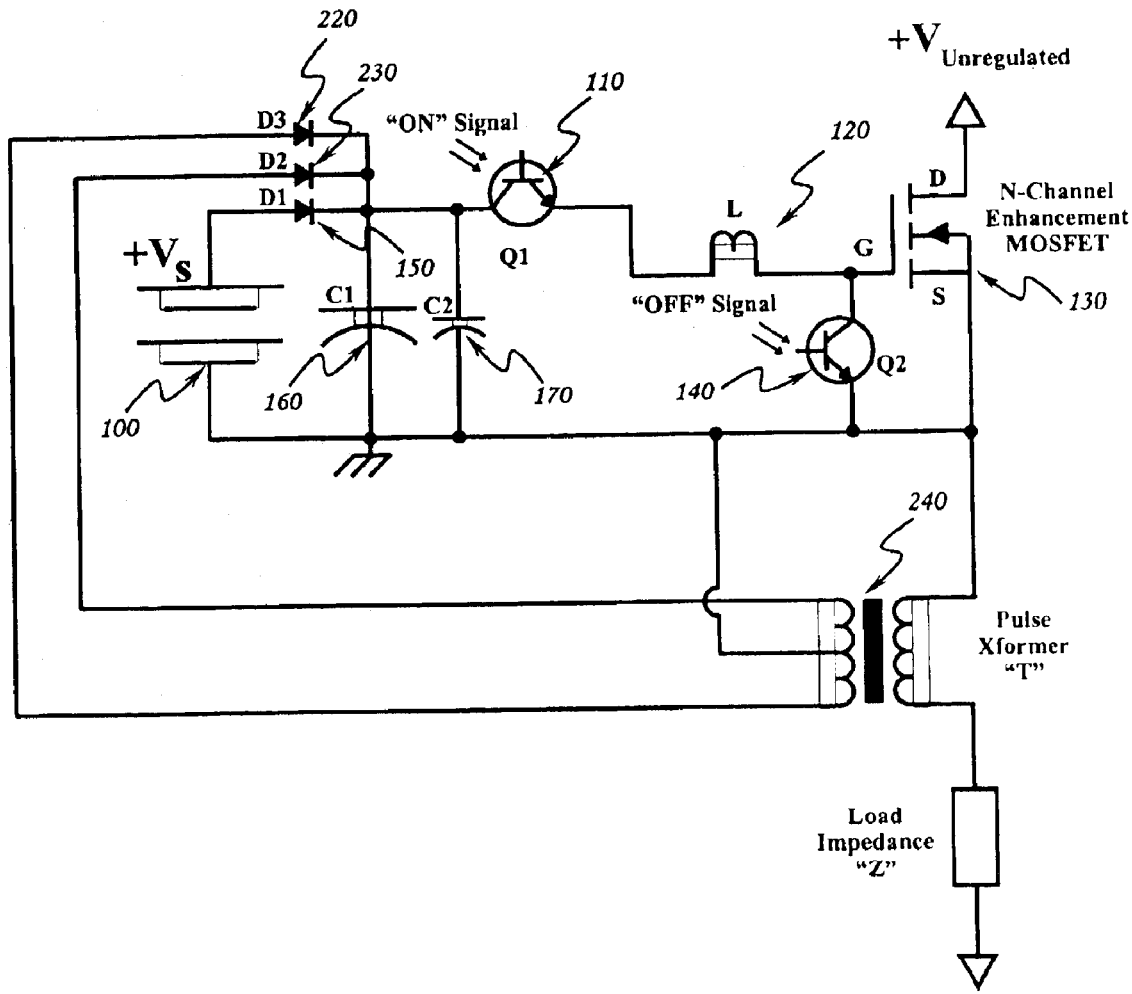
FIG. 5 depicts a schematic of a self-powered embodiment of the present invention using a pulse transformer.
Figure 6:
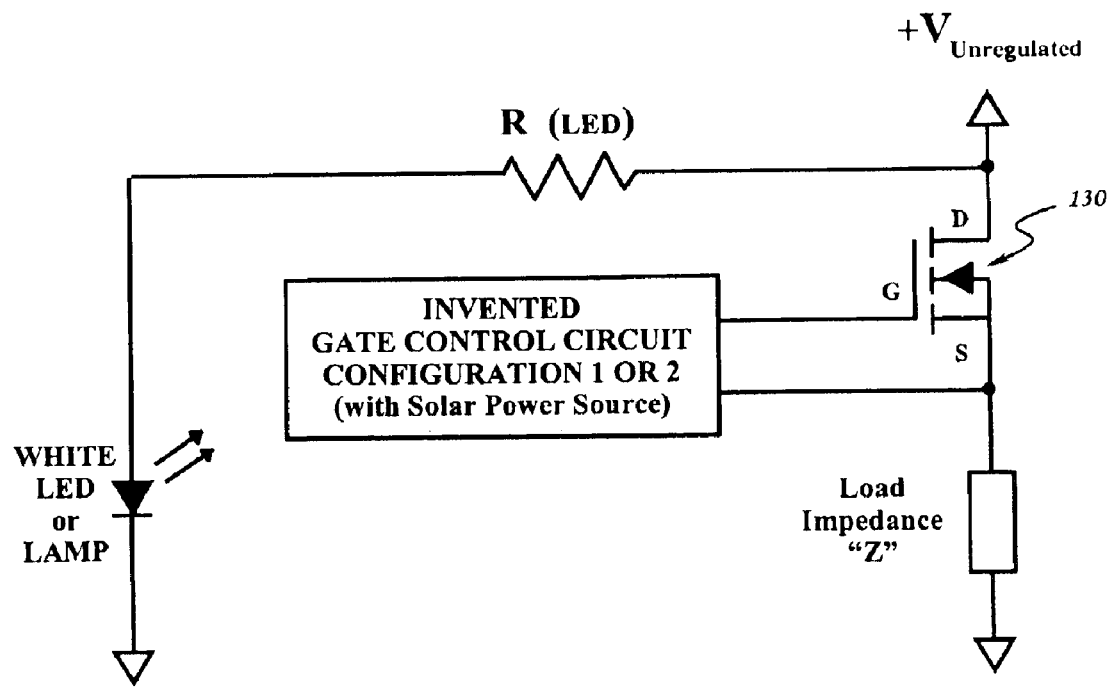
FIG. 6 depicts a schematic of a self-powered embodiment of the present invention using a solar power source.

Referring to FIG. 5 and FIG. 6, two different self-powered embodiments of the preferred embodiment of the present invention (see FIG. 1) are depicted. FIG. 5 uses a pulse transformer 240 inline with the load impedance. This transformer 240 does not have to be high voltage isolating because both the primary and secondary windings are connected to the same voltage potential at the source terminal of the MOSFET 130. This self-powered embodiment is possible if the load is amenable to the small added inductance of the transformer's 240 primary winding. The center tapped pulse transformer 240 secondary used in the embodiment depicted in FIG. 5 provides charging currents which flow through the rectifying diodes D2 230 and D3 220 into the energy storage capacitance 160. A center-tapped secondary allows charging currents to flow for both "on" and "off" switching transitions. A transformer 240 without a center tap can be used but will then only charge on one direction of the switching transitions. To protect the bias circuit from overvoltage charging if the transformer charging currents become too high, a voltage-limiting device (not shown) such as a Zener diode with a series limiting resistor may be placed in parallel with the energy storage capacitor 160. The bias voltage source $V_S$ 100 can have a rechargeable battery, which could be recharged during operation and then, when the circuit is cold started, there will be voltage available to begin pulsed operation and resume recharging. This pulse transforming self-powered embodiment will require a certain minimum pulse frequency to be able to recharge the power supply. The solar self-powered embodiment (see FIG. 6), does not have these operational frequency constraints.

Figure 7A:
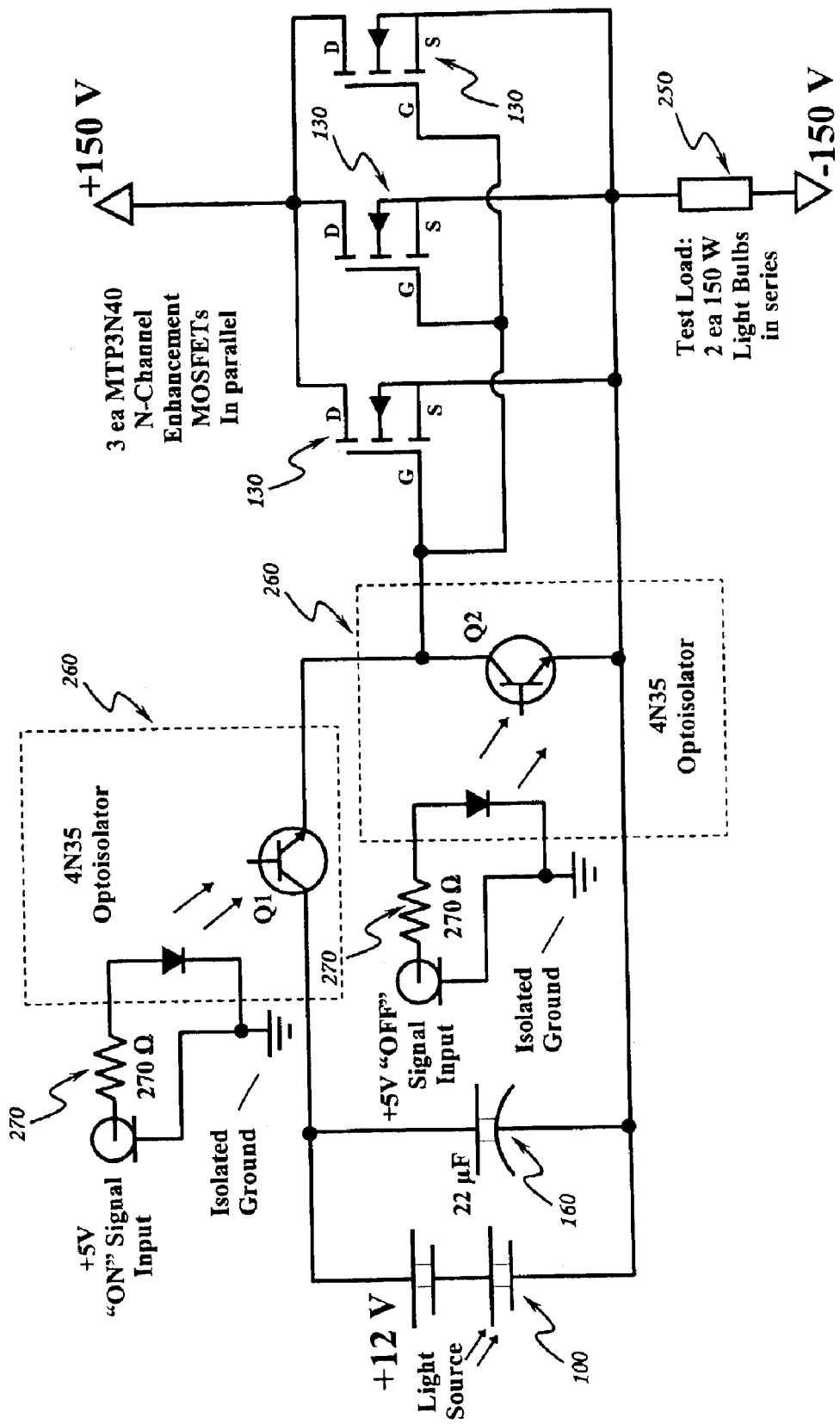
FIG. 7A depicts a schematic of an actual implementation of the preferred embodiment of the present invention of FIG. 1.

Referring to FIG. 7A, a schematic of a simple, low cost implementation of the preferred embodiment of FIG. 1 is depicted. This implementation was tested using a load 250 of two series connected 150 watt, 120 volt, incandescent light bulbs. A parallel connection of three, low cost ($0.39 ea), MTP3N40 N-channel enhancement-mode MOSFETs 130 (internal freewheel diodes are not shown) were used to drive the test load 250. These parallel-connected MOSFETs 130 operated at cool temperatures (to the touch), even without heat sinks, for all but the highest frequency test conditions. MOSFETs connected in parallel can provide high currents to the load impedance than can an individual MOSFET. Two, low cost ($0.16 ea), 4N35 optoisolators 260 (functional equivalent of Q1 110 and Q2 140 in FIG. 1, FIG. 2 and FIG. 5) provide the isolated signal drive for the complementary gate control. The optoisolators 260 are driven by +5 volt pulses which produce about 16 mA of current through the 270 ohm series resistors 270. The bias voltage source 100 consists of two very small series connected, 6 V, 1.5 mA solar panels (not shown) in parallel with a 22 microfarad tantalum capacitor (C1) 160. A diode (not shown) in series with the solar panels was not used for this implementation but can be added to maintain the voltage on the capacitor C1 160 if the light source is removed. The capacitance of C1 160 will affect the number of switching cycles which can occur before the voltage falls below the switching threshold. These parts used for this implementation of the invention were readily available commercial-off-the-shelf (COTS) parts. The frequency of this implementation was limited to about 10 kHz by the limited drive current of the solar panels. Higher current solar cells or a battery would be able to drive these MOSFETs 130 to higher frequencies.

Figure 7B:
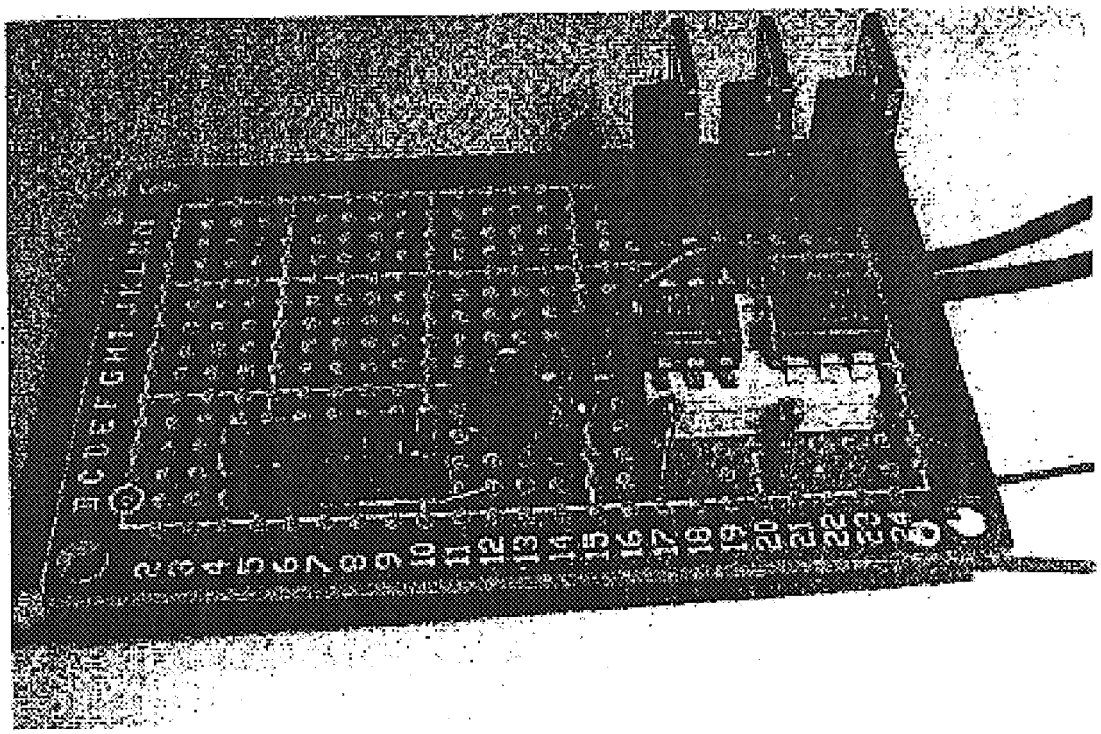
FIG. 7B depicts a photograph of an actual implementation of the preferred embodiment of the present invention of FIG. 1.

Referring to FIG. 7B, a photograph of the completed circuit of FIG. 7A is shown.

Figure 8:
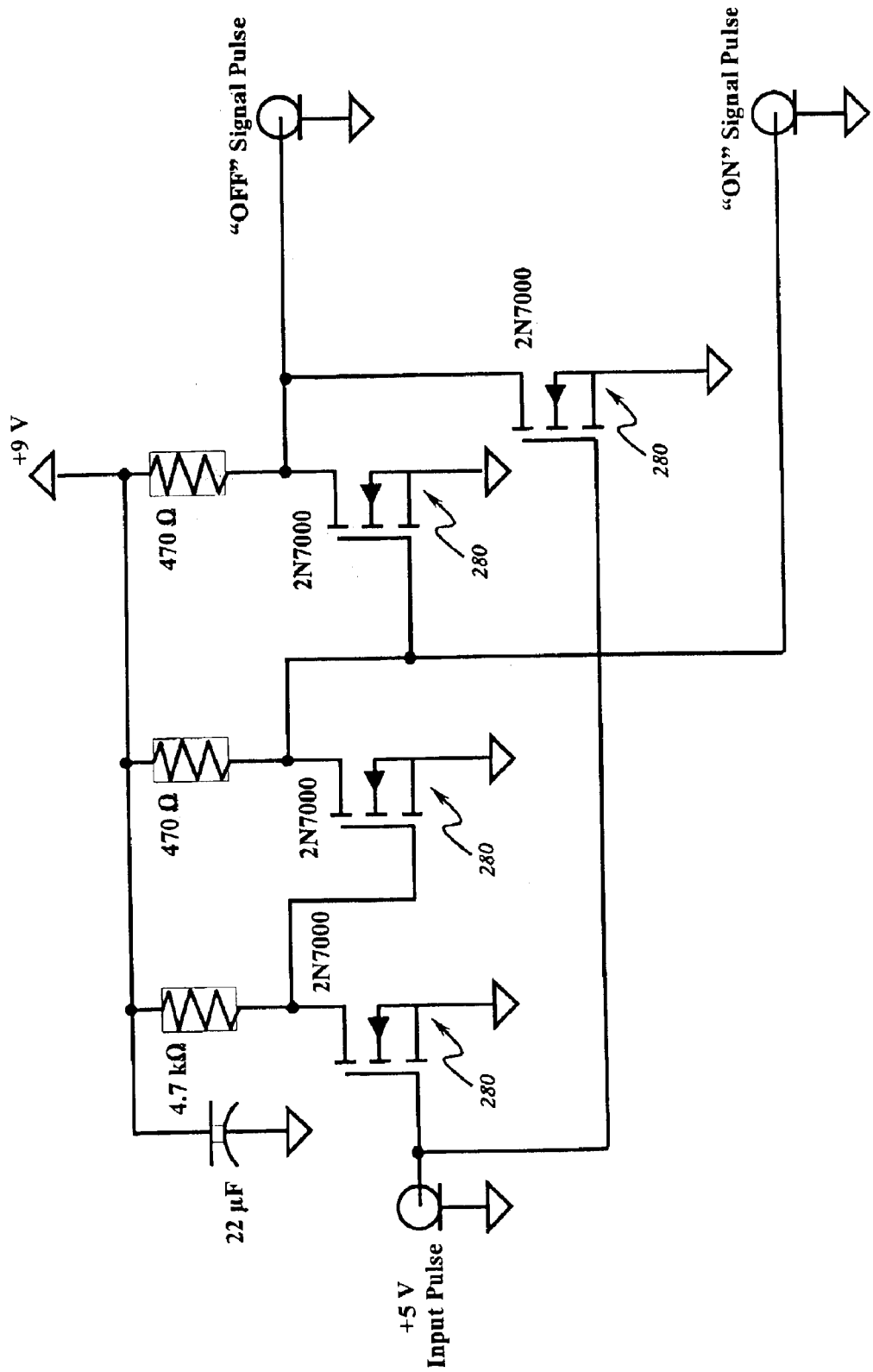
FIG. 8 depicts a schematic of a circuit which generates both "ON" and "OFF" signal; complementary pulse timing from a single input pulse as depicted in FIG. 3.

Referring to FIG. 8, a simple circuit using only four, low cost ($0.10 ea), small signal 2N7000 N-channel enhancement-mode MOSFETs 280 which generates a typical complementary pulse timing (see FIG. 3), including both of the two required small, device dependent (approx. 10 ns in this case), "dead times", between the complementary pulses. Both complementary pulses are generated from a single input pulse which is of the same duration as the complementary "ON" signal output pulse. The "dead" times are useful to achieve minimal charge flow but can be eliminated by pulse timing overlap within the rise and fall times of the "ON" and "OFF" signals if very high voltage or very high current switching is needed or when bias noise immunity is more important than bias circuit efficiency.

While the preferred embodiments have been described and illustrated, it should be understood that various substitutions, equivalents, adaptations and modifications of the invention may be made thereto by those skilled in the art without departing from the spirit and scope of the invention. Accordingly, it is to be understood that the present invention has been described by way of illustration and not limitation.

What is claimed is:

1. An optically isolated bias control circuit, comprising:
   a bias voltage source connected in series with a diode, the anode of said diode being connected to the positive terminal of said bias voltage source, the cathode of said diode being connected to the collector of a first phototransistor, the negative terminal of said bias voltage source being connected to a floating ground;
   an energy storage capacitor and a low inductance capacitor both connected in parallel with each other and in parallel with said series connected bias voltage source and said diode, wherein the positive terminal of each of said energy storage capacitors and said low inductance capacitor is connected to said collector of said first phototransistor, the negative terminal of each of said capacitors being connected to said floating ground; and
   a second phototransistor and an inductor, said inductor being connected between the collector of said second phototransistor and the emitter of said first phototransistor, the emitter of said second phototransistor being connected to said floating ground, and the collector of said second phototransistor being further connectable so as to drive the input of a high input impedance switching device for switching a voltage across a load impedance.

2. The optically isolated bias control circuit of claim 1, wherein said high input impedance switching device is an N-channel enhancement MOSFET, the gate of which is connected to said collector of said second photo transistor, the drain of which is connected to the positive terminal of a drain voltage source, the source of which is connected to said floating ground, and said load impedance being connected between said floating ground and the negative terminal of said drain voltage source.

3. An optically isolated bias control circuit, comprising:
a bias voltage source connected in series with a diode, the anode of said diode being connected to the positive terminal of said bias voltage source, the cathode of said diode being connected to the collector of a first phototransistor, the negative terminal of said voltage source being connected to the emitter of a third phototransistor;
an energy storage capacitor and a low inductance capacitor both connected in parallel with each other and in parallel with said series connected bias voltage source and said diode, wherein the positive terminal of each of said energy storage capacitor and said low inductance capacitor is connected to said collector of said first phototransistor, the negative terminal of each said capacitors being connected to said emitter of said third phototransistor;
a second phototransistor having its collector connected through an inductor to the emitter of said first phototransistor and also having its collector being connectable so as to drive the input of a high input impedance switching device for switching a voltage across a load impedance; and
a fourth phototransistor having its collector connected to said collector of said first phototransistor and having its emitter connected to said collector of said third phototransistor.

4. The optically isolated bias control circuit of claim 3, wherein said high input impedance switching device is an N-channel enhancement MOSFET, the gate of which is connected to both said emitter of said first phototransistor through said inductance and to said collector of said second phototransistor, the drain of which is connected to the positive terminal of a drain voltage source, and the source of which is connected to said collector of said third phototransistor, said source being further connected to the first terminal of a load impedance, wherein the second terminal of said load impedance is connected to the negative terminal of said drain voltage source.

5. A high-voltage optically isolated bias control circuit, comprising:
a plurality of said optically isolated bias control circuits of claim 2 or claim 4;
wherein, for each of said plurality of said optically isolated bias control circuits, a voltage surge suppressor, wherein the first terminal of said voltage surge suppressor is connected to said drain of said N-channel enhancement MOSFET and the second terminal of said voltage surge suppressor is connected to said source of said N-channel enhancement MOSFET; and
wherein each of said plurality of said optically isolated bias control circuits is connected in series with a high voltage source and a load impedance.

6. The high-voltage optically isolated bias control circuit of claim 5, wherein said voltage surge suppressor is selected from the group of voltage surge suppressors consisting of metal oxide varistor types and snubber circuit types, wherein said snubber circuit types further comprise a series connected capacitor and resistor.

7. A self-powered, optically isolated bias control circuit, comprising:
said optically isolated bias control circuit of claim 2 or claim 4; and
a pulse transformer, wherein
the primary winding is connected in series between said source of said N-channel enhancement MOSFET and a load impedance,
a center tap of the secondary winding is connected of said source of said N-channel enhancement MOSFET,
one end of said secondary winding is connected to the anode a second diode, with the cathode of said second diode being connected to said collector of said first phototransistor, and
the other end of said secondary winding is connected to the anode of a third diode, with the cathode of said third diode also being connected to said collector of said first phototransistor.

8. A solar-powered, optically isolated bias control circuit, comprising:
said optically isolated bias control circuit of claim 2 or claim 4;
a light-emitting device; and
a resistor;
wherein said light emitting device and said resistor are connected in series with each other between said drain of said N-channel enhancement MOSFET and said negative terminal of said drain voltage source.

9. The solar-powered, optically isolated bias control circuit of claim 8, wherein said light-emitting device is selected from the group consisting of white LEDs and lamps.

10. An embodiment of the optically isolated bias control circuit of claim 2, wherein:
said high input impedance switching device comprises three parallel-connected type MTP3N40 N-channel enhancement-mode MOSFETs connected as in claim 2;
said first and said second phototransistors are type 4N35 optoisolators;
a 270 ohm resistor is connected in series with the +5 volt pulse drive signal to each of the input LEDs of said first and said second phototransistors so as to limit said input LED drive current to approximately 16 mA;
said energy storage capacitor is a 22 microfarad tantalum capacitor; and
said bias voltage source comprises a pair of 6 volt, 1.5 mA solar panels.

11. The embodiment of the optically isolated bias control circuit as in claim 10, further comprising means for generating said +5 volt pulse drive signal, said means for generating comprising:
a first type 2N7000 N-channel enhancement-mode MOSFET, wherein its drain is connected to a +9 volt supply voltage through a series 4.7 kilo-ohm resistor, its source connected to ground and its gate connected to a +5 volt input pulse signal means;
a second type 2N7000 N-channel enhancement-mode MOSFET, wherein its drain is connected to a +9 volt supply voltage through a series 470 ohm resistor, its source connected to ground and its gate connected to said drain of said first type 2N7000 N-channel enhancement-mode MOSFET;

a third type 2N7000 N-channel enhancement-mode MOSFET, wherein its drain is connected to a +9 volt supply voltage through a series 470 ohm resistor, its source connected to ground and its gate connected to said drain of said second type 2N7000 N-channel enhancement-mode MOSFET;

a fourth type 2N7000 N-channel enhancement-mode MOSFET, wherein its drain is connected to said drain of said third type 2N7000 N-channel enhancement-mode MOSFET, its source connected to ground and its gate connected to both said drain of said first type 2N7000 N-channel enhancement-mode MOSFET and said +5 volt input pulse signal;

a 22 microfarad capacitor connected between said +9 volt supply voltage and each of said resistors;

means for extracting an "OFF" signal pulse connected to said drain of both said third and said fourth type 2N7000 N-channel enhancement-mode MOSFETs; and means for extracting an "ON" signal pulse connected to both said drain of said second type 2N7000 N-channel enhancement-mode MOSFET and said gate of said third type 2N7000 N-channel enhancement-mode MOSFET.

* * * * *